(12) United States Patent
Yang et al.

(10) Patent No.: US 8,461,634 B2
(45) Date of Patent: Jun. 11, 2013

(54) DIVOT ENGINEERING FOR ENHANCED DEVICE PERFORMANCE

(75) Inventors: Lie-Yong Yang, Hsinchu (TW); Sheng Chiang Hung, Hsinchu (TW); Kian-Long Lim, Hsinchu (TW); Ping-Wei Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 58 days.

(21) Appl. No.: 13/087,016

(22) Filed: Apr. 14, 2011

(65) Prior Publication Data
US 2012/0261726 A1   Oct. 18, 2012

(51) Int. Cl.
*H01L 29/772* (2006.01)
*H01L 21/28* (2006.01)

(52) U.S. Cl.
USPC ............... 257/288; 438/585; 257/E29.242; 257/E21.158

(58) Field of Classification Search
USPC ............ 257/288, E29.242, E21.158; 438/585
See application file for complete search history.

(56) References Cited

U.S. PATENT DOCUMENTS

| | | | |
|---|---|---|---|
| 6,323,532 B1 | 11/2001 | Joachim et al. | |
| 7,332,394 B2 * | 2/2008 | Chiang | 438/246 |
| 7,838,355 B2 | 11/2010 | Anderson et al. | |
| 7,964,910 B2 * | 6/2011 | Dyer | 257/327 |
| 2009/0302374 A1 | 12/2009 | Anderson et al. | |

* cited by examiner

*Primary Examiner* — Calvin Lee
*Assistant Examiner* — Monica D Harrison
(74) *Attorney, Agent, or Firm* — Haynes and Boone, LLP (57) ABSTRACT

An integrated circuit device and method for manufacturing the same are disclosed. An exemplary device includes a semiconductor substrate having a substrate surface; a trench isolation structure disposed in the semiconductor substrate, the trench isolation structure having a trench isolation structure surface that is substantially planar to the substrate surface; and a gate feature disposed over the semiconductor substrate, wherein the gate feature includes a portion that extends from the substrate surface to a depth in the trench isolation structure, the portion being defined by a trench isolation structure sidewall and a semiconductor substrate sidewall, such that the portion tapers from a first width at the substrate surface to a second width at the depth, the first width being greater than the second width.

20 Claims, 12 Drawing Sheets

DIVOT ENGINEERING FOR ENHANCED DEVICE PERFORMANCE

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, conventional IC processing strives to minimize divot formation in isolation features used to isolate various devices, such as field-effect transistor devices, from one another. Divot formation is minimized to reduce junction leakage. Consequently, this confines device performance to a top surface channel, which confines device performance boosting as device technology nodes scale down. Fin-like field-effect transistors (FinFET) devices have provided an additional sidewall channel, however, FinFET device processing is complex and costly when compared to conventional planar device processing. Accordingly, although existing IC devices and methods have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
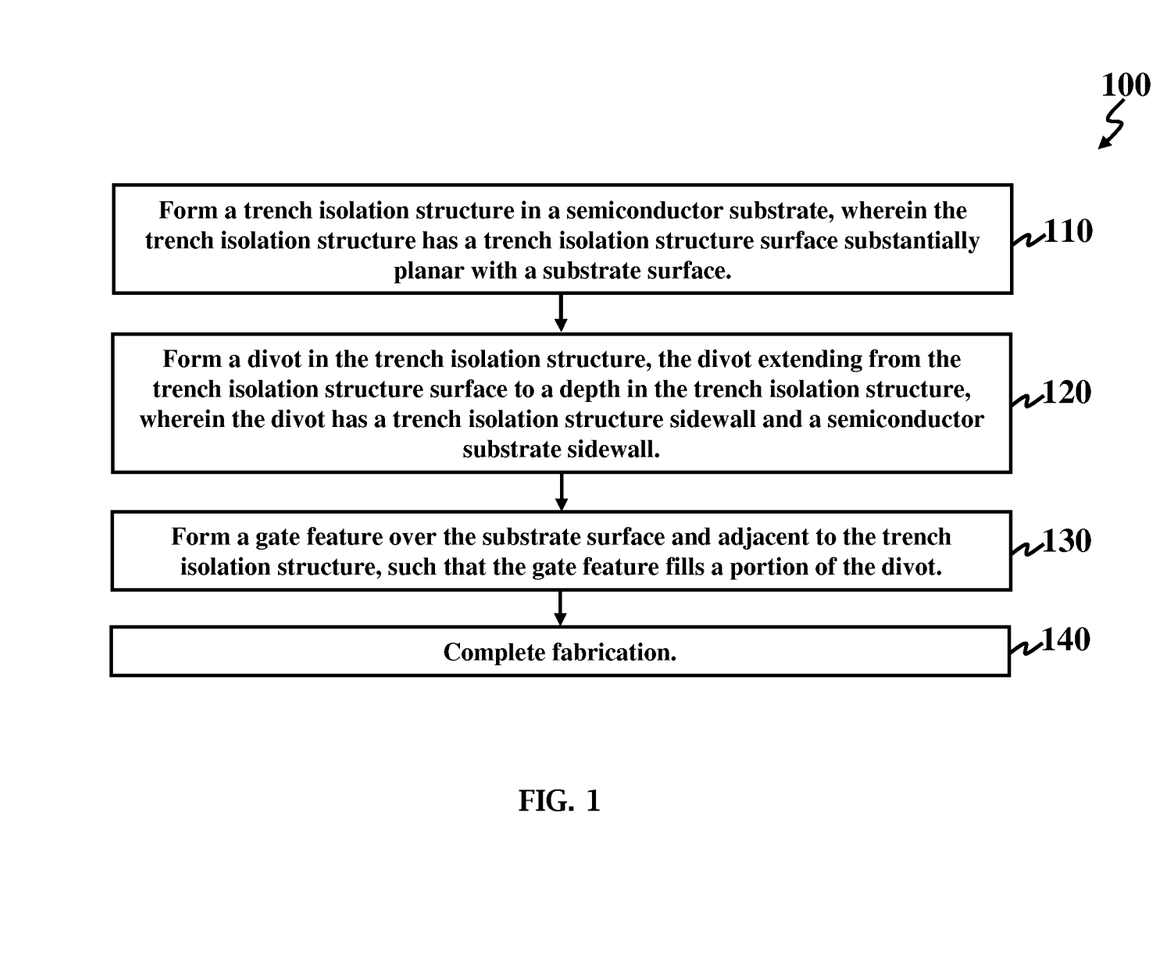
FIG. 1 is a flow chart of a method for fabricating an integrated circuit device according to various aspects of the present disclosure.

FIG. 1 is a flow chart of a method 100 for fabricating an integrated circuit device according to various aspects of the present disclosure. More specifically, the method 100 fabricates an integrated circuit device having divots engineered to improve device performance. The method 100 begins at block 110 where a trench isolation structure is formed in a semiconductor substrate. The semiconductor substrate has a substrate surface, and the trench isolation structure has a trench isolation structure surface that is substantially planar with the substrate surface. At block 120, a divot is formed in the trench isolation structure. The divot extends from the trench isolation structure surface to a depth in the trench isolation structure. The divot includes a sidewall formed by the trench isolation structure and a sidewall formed by the semiconductor substrate. In the depicted embodiment, the divot is formed without using a mask. For example, the trench isolation structure is etched to form the divot without using a mask. In an example, a dummy gate feature may be disposed over the semiconductor substrate, and an etching process that is used to remove the dummy gate feature may also be used to simultaneously form the divot in the trench isolation structure. At block 130, a gate feature is formed over the substrate surface and adjacent to the trench isolation structure. The gate feature fills a portion of the divot. The method 100 continues with block 140 where fabrication of the integrated circuit device is completed. For example, a source feature and a drain feature are formed on the substrate surface, such that the gate feature interposes the source feature and the drain feature. A silicide feature may be formed over the source feature and the drain feature, for example, over a top surface of the source and drain features. Additional steps can be provided before, during, and after the method 100, and some of the steps described can be replaced or eliminated for other embodiments of the method. The discussion that follows illustrates various embodiments of integrated circuit devices having divots engineered to enhance device performance that can be fabricated according to the method 100 of FIG. 1.

FIGS. 2A-2C, 3A-3C, 4A-4C, 5A-5C, and 6A-6C provide various views of an integrated circuit device 200, in portion or entirety, at various stages of fabrication according to the method 100 of FIG. 1. The integrated circuit device 200 may be an integrated circuit chip, system on chip (SoC), or portion thereof, that includes various passive and active microelectronic devices such as resistors, capacitors, inductors, diodes, metal-oxide semiconductor field effect transistors (MOSFETs), complementary metal-oxide semiconductor (CMOS)

transistors, high voltage transistors, high frequency transistors, other suitable components, or combinations thereof. In the depicted embodiment, the integrated circuit device 200 includes a field-effect transistor (FET) device. More specifically, the depicted embodiment illustrates three FET devices of the integrated circuit device 200. The three illustrated FET devices are for illustration purposes only, and it is understood that the integrated circuit device 200 may include fewer or more than the three illustrated FET devices. FIGS. 2A-2C, 3A-3C, 4A-4C, 5A-5C, and 6A-6C have been simplified for the sake of clarity to better understand the inventive concepts of the present disclosure. Additional features can be added in the integrated circuit device 200, and some of the features described below can be replaced or eliminated in other embodiments of the integrated circuit device 200.

Figure 2A:
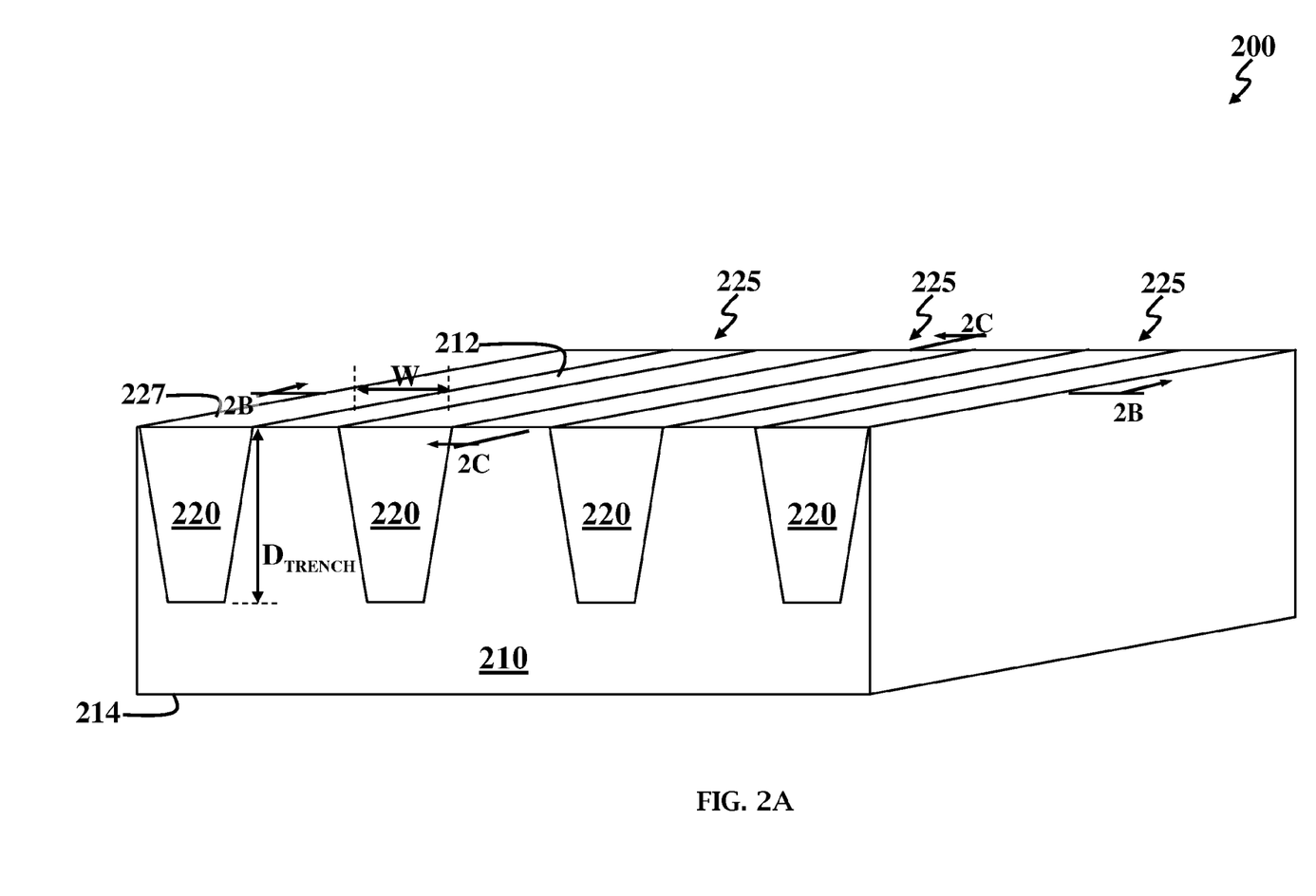
FIGS. 2A, 3A, 4A, 5A, and 6A are perspective views of an integrated circuit device at various fabrication stages according to the method of FIG. 1.
Figure 2B:
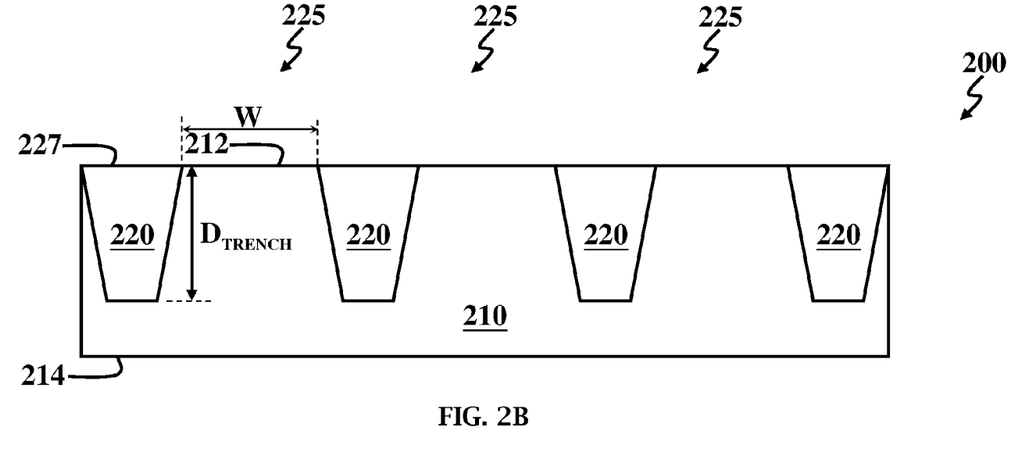
FIGS. 2B-2C, 3B-3C, 4B-4C, 5B-5C, and 6B-6C are diagrammatic cross-sectional views of the integrated circuit device of FIGS. 2A, 3A, 4A, 5A, and 6A, respectively.
Figure 2C:
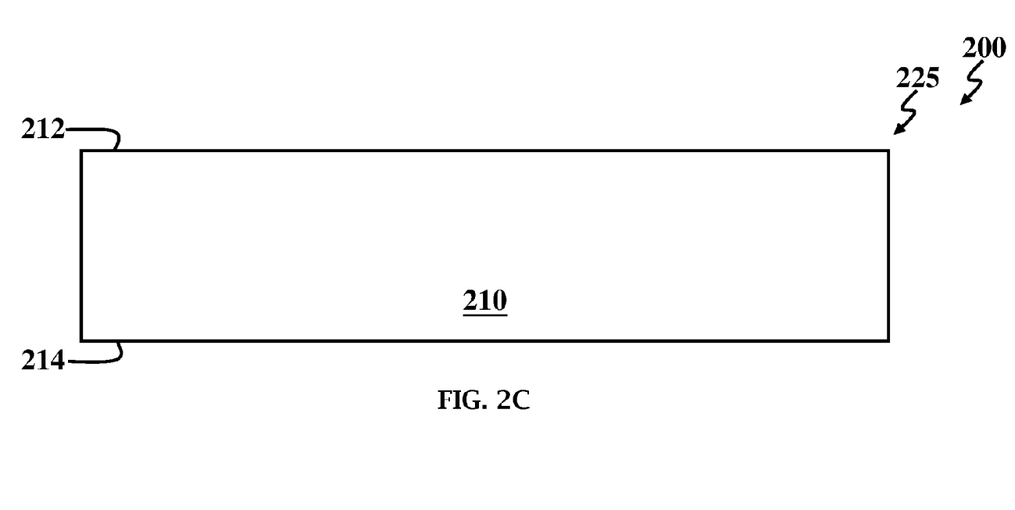

FIG. 2A is a perspective view of the integrated circuit device 200, FIG. 2B is a diagrammatic cross-sectional view of the integrated circuit device 200 taken along line 2B-2B in FIG. 2A, and FIG. 2C is a diagrammatic cross-sectional view of the integrated circuit device 200 taken along line 2C-2C in FIG. 2A. The integrated circuit device 200 includes a substrate (wafer) 210 having a surface 212 and a surface 214 that is opposite the surface 212. The surface 212 may be referred to as a top surface of the substrate 210, and the surface 214 may be referred to as a bottom surface of the substrate 210. In the depicted embodiment, the substrate 210 is a semiconductor substrate including silicon. Alternatively or additionally, the substrate 210 includes an elementary semiconductor, such as germanium; compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In another alternative, semiconductor substrate 210 may include a doped epi layer, a gradient semiconductor layer, and/or a semiconductor layer overlying another semiconductor layer of a different type, such as a silicon layer on a silicon germanium layer. The substrate 210 may include various doped regions depending on design requirements as known in the art (e.g., p-type wells or n-type wells). The doped regions may be doped with p-type dopants, such as boron or $BF_2$; n-type dopants, such as phosphorus or arsenic; or a combination thereof. The doped regions may be formed directly on the substrate 210, in a P-well structure, in a N-well structure, in a dual-well structure, or using a raised structure.

Isolation features 220 are disposed in the substrate 210. In the depicted embodiment, the isolation features 220 isolate FET device regions 225 from one another. As described further below, a FET device is formed in each of the FET device regions 225. Each FET device region 225 has a width, W. In an example, W is about 10 nanometers to about 10,000 nanometers. Each isolation feature 220 extends from the substrate surface 212 to a depth, $D_{TRENCH}$, in the substrate 210. In an example, $D_{TRENCH}$ is about 50 nanometers to about 500 nanometers. Each isolation feature 220 has a surface 227 that is substantially parallel to the surface 212 of the substrate 210. The isolation features 220 utilize isolation technology, such as local oxidation of silicon (LOCOS) and/or shallow trench isolation (STI), to define and electrically isolate the various regions, such as the FET device regions 225. In the depicted embodiment, the isolation features 220 are trenches, specifically shallow trench isolation trenches, that are filled with a dielectric material, such as silicon oxide, silicon nitride, silicon oxynitride, other suitable materials, or combinations thereof. The isolation features 220 may be formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure, such as a thermal oxide liner layer filled with silicon nitride or silicon oxide.

Figure 3A:
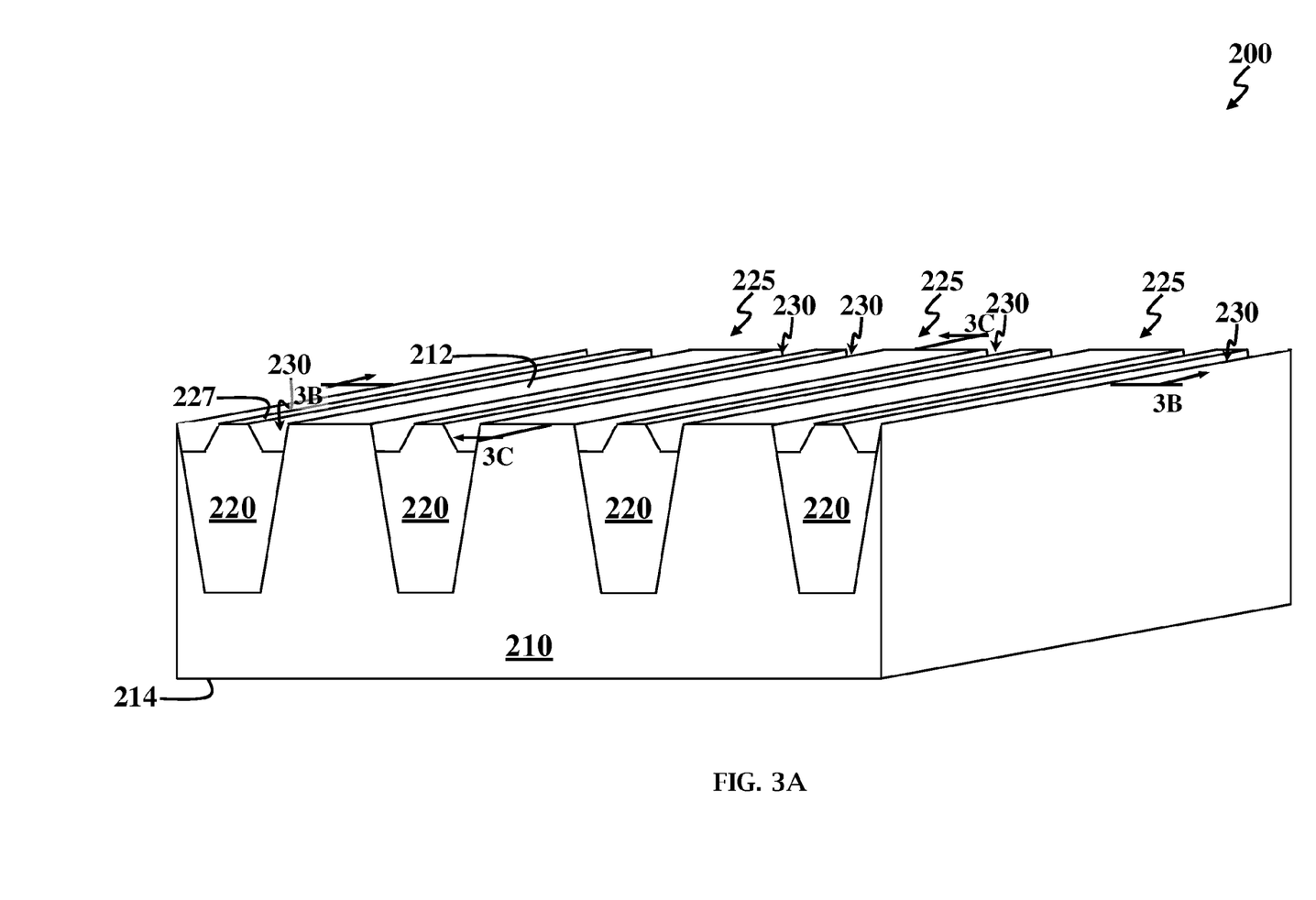
Figure 3B:
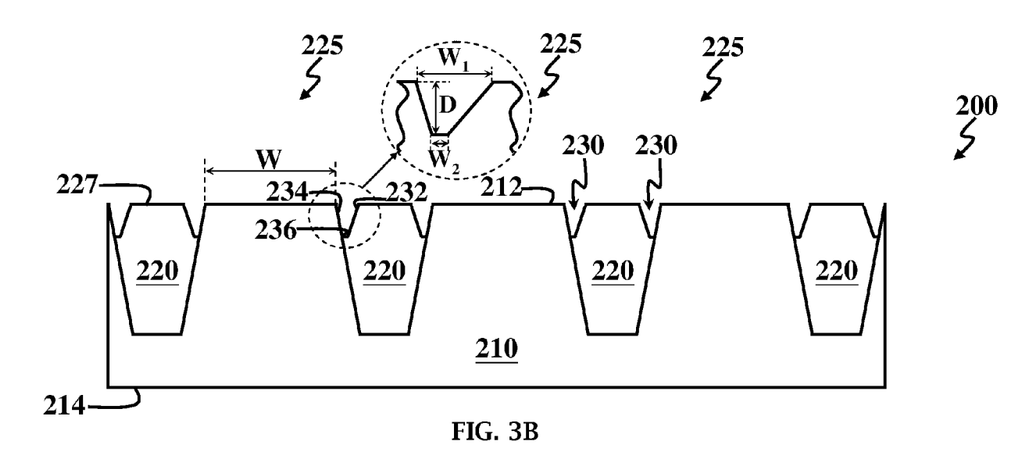
Figure 3C:
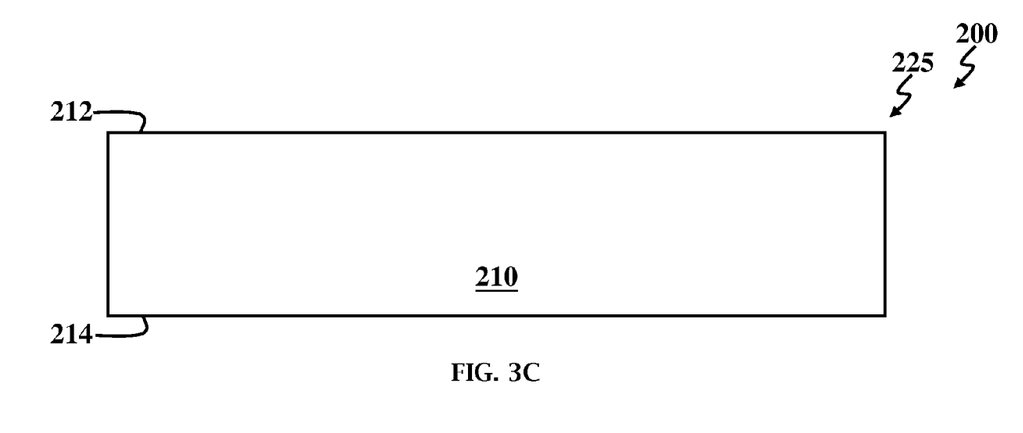

FIG. 3A is a perspective view of the integrated circuit device 200, FIG. 3B is a diagrammatic cross-sectional view of the integrated circuit device 200 taken along line 3B-3B in FIG. 3A, and FIG. 3C is a diagrammatic cross-sectional view of the integrated circuit device 200 taken along line 3C-3C in FIG. 3A. In FIGS. 3A-3C, the isolation features 220 include divots 230. The divots 230 are formed by a process that is tuned to achieve a profile for the divots 230 that enhances performance of the integrated circuit device 200. More specifically, the divots 230 adjacent to each FET device region 225 can enhance performance of the FET device formed in the respective FET device region 225. In the depicted embodiment, an etching process is tuned to achieve a suitable profile for the divots 230. The etching process may be a dry etching process, a wet etching process, other suitable etching process, or combinations thereof. For example, a wet etching process that implements a hydrofluoric (HF) based etching solution, such as a buffer hydrofluoric acid or diluted hydrofluoric acid (DHF) etching solution, may be used to achieve suitable profiles for the divots 230. In an example, the divots 230 are formed by applying a wet etching process using the HF based etching solution to the isolation features 220 for a time of about 1 second to about 100 seconds at about room temperature.

Divot processing typically uses a mask to protect various portions of the device. In contrast, in the depicted embodiment, the etching process is applied to the integrated circuit device without using a mask. The etching process thus selectively etches the trench isolation structure 220, without etching the substrate 220. In an example, before the divots are formed, a dummy gate feature may be disposed over a portion of each FET device region 225, specifically over the surface 212 of the substrate 210 in a portion of each FET device region 225. An etching process that is used to remove the dummy gate feature (for example, to be replaced by a high-k/metal gate feature) can also be used to simultaneously form the divots 230. Accordingly, the dummy gate feature is removed and the divots are formed without having to use a mask. Further, conventional devices often require different divot profiles for an n-type FET (NFET) and a p-type FET (PFET). In contrast, in the depicted embodiment, a profile of the divots, described below, can be used in an n-type FET (NFET), a p-type FET (PFET), or both. Since the profile of the divots is suitable for both NFET and PFET devices, a mask is not required to shield NFET device regions or PFET device regions when forming the divots.

In FIG. 3B, a profile of one of the divots 230 is enlarged. The divot 230 extends from the surface 227 of the isolation feature 220 to a depth, D, in the isolation feature 220. In the depicted embodiment, D is about 5 nanometers to about 40 nanometers. The divot 230 includes a surface (or sidewall) 232, a surface (or sidewall) 234, and a bottom surface (or bottom wall) 236. The sidewall 232 is formed by the isolation feature 220, tapering from the surface 227 of the isolation feature 220 to the depth, D, in the isolation feature 220. The sidewall 234 is formed by the substrate 210, extending from the surface 212 of the substrate 210 to the depth, D, in the isolation feature 220. The bottom wall 236 is formed by the isolation feature 220, intersecting and extending between the sidewalls 232 and 234. In the depicted embodiment, the bottom wall 236 is substantially parallel to the substrate surface 212 and the isolation feature surface 227. The divot 230 has a width that tapers from a width, $W_1$, to a width, $W_2$. In an example, $W_1$ is about 3 nanometers to about 20 nanometers, and $W_2$ is greater than or equal to about 3 nanometers (such as about 6 nanometers to about 30 nanometers). In an example, a ratio of $W_1$ to $W_2$ is about 1:1 to about 1:10. In an example, a ratio of D to W is about 4:1.

Figure 4A:
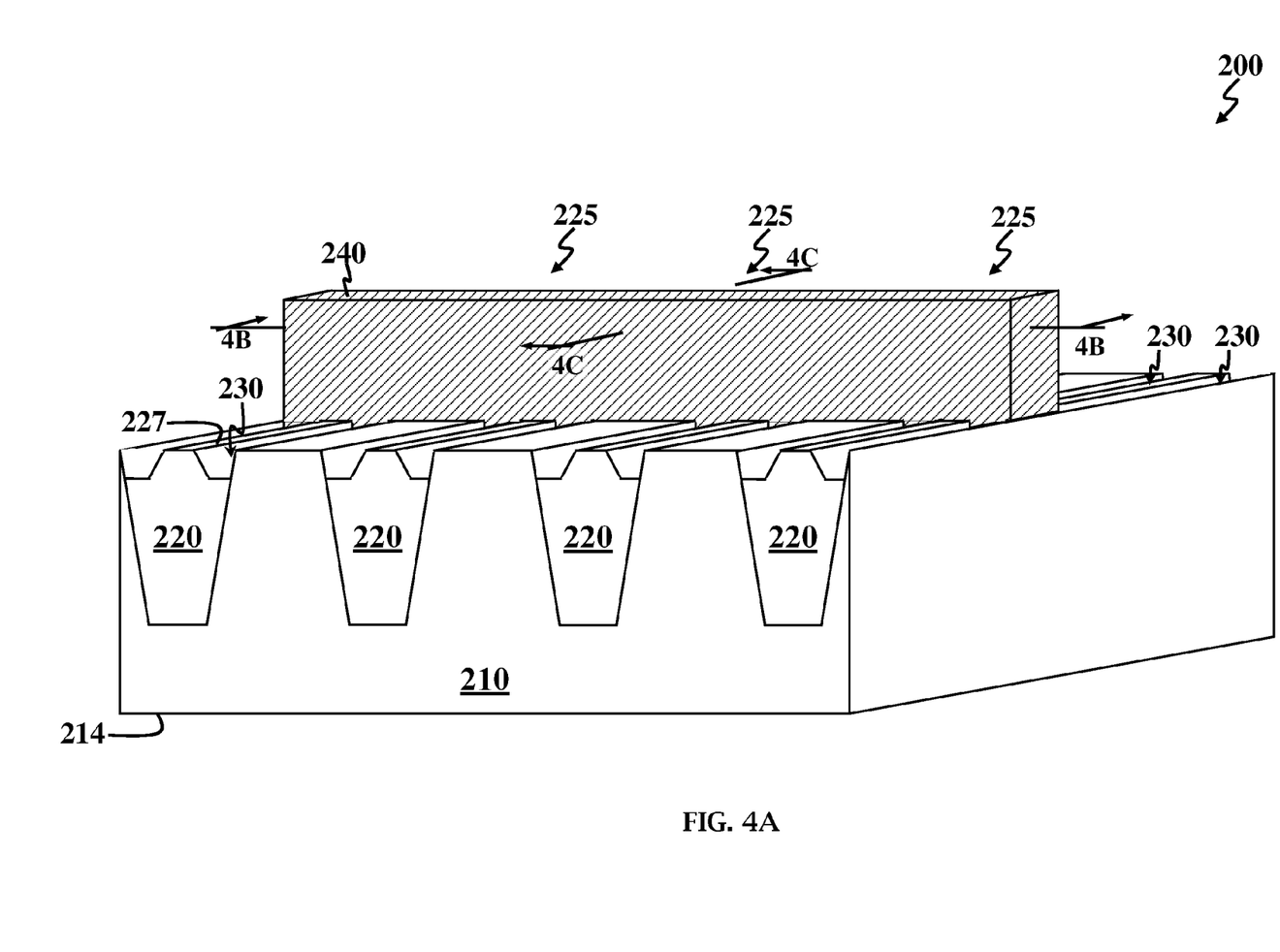
Figure 4B:
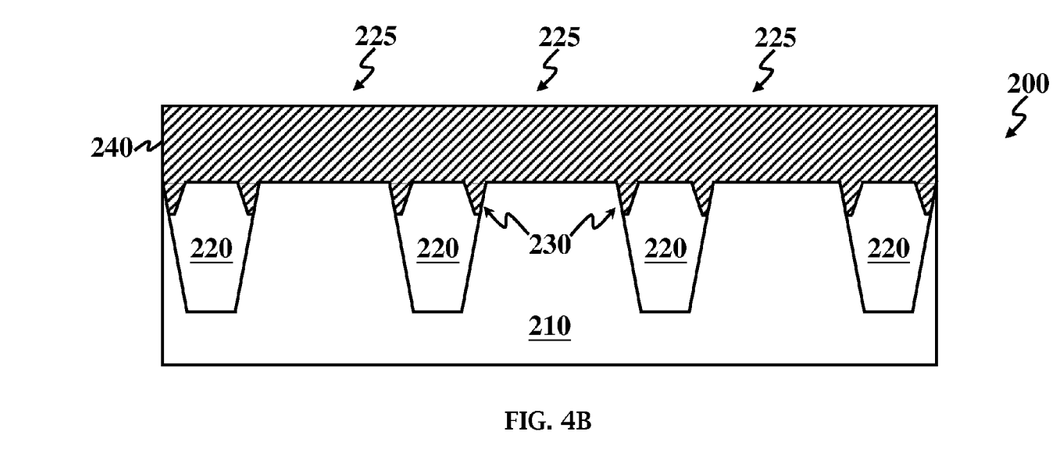
Figure 4C:
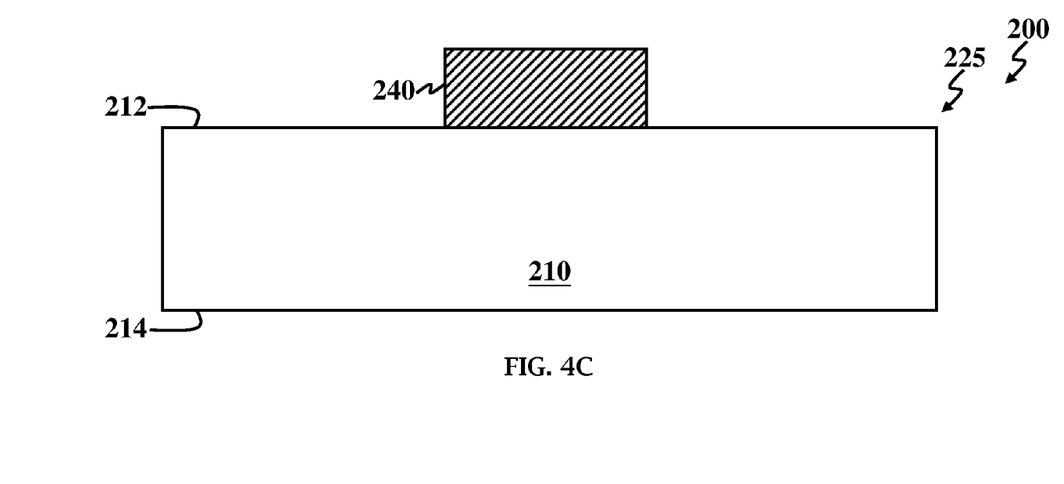

FIG. 4A is a perspective view of the integrated circuit device 200, FIG. 4B is a diagrammatic cross-sectional view of the integrated circuit device 200 taken along line 4B-4B in FIG. 4A, and FIG. 4C is a diagrammatic cross-sectional view of the integrated circuit device 200 taken along line 4C-4C in FIG. 4A. In FIGS. 4A-4C, a gate feature 240 is disposed over substrate 210. The gate feature 240 is disposed over a portion of each FET device region 225, specifically over the surface 212 of the substrate 210 in a portion of each FET device region 225. The gate feature 240 fills a portion of the divots 230. More specifically, along a gate region of the FET devices, the gate feature 240 fills the divots 230. The divots 230 provide an area where the gate feature 240 covers both a top surface (substrate surface 212) and side surfaces (divot sidewalls 234) of the substrate 210. Providing the divots 230 adjacent to the gate feature 240, such that the gate feature 240 covers both top and side surfaces of the substrate 210, increases an effective width of the FET device formed in each FET device region 225, which can enhance FET device performance. Further, having the gate feature 240 cover the side surfaces of the substrate 210 (divot sidewalls 234) can improve short channel effects of the FET devices in each FET device region 225, and can reduce dopant concentrations (for example, required for lightly doped and/or heavily doped source and drain regions) necessary to achieve various threshold voltages. Accordingly, in the depicted embodiment, a dopant concentration used to achieve a threshold voltage is lower than that which would be required in a conventional device. The divot profile described above optimizes device performance. For example, if D (depth of divots 230) is less than 5 nanometers, the gate feature 240 may not sufficiently cover side surfaces of the substrate 210 to increase the FET devices effective width, and thus current gain may be similar to conventional planar FET devices. And, if D is greater than 40 nanometers, process issues arise that can negatively affect device performance, such as material residue, difficulty in filling the divots 230 with the gate feature 240, difficulty in patterning various features of the FET devices in each FET device region 225.

The gate feature 240 includes a gate dielectric layer and a gate electrode (not separately illustrated). The gate dielectric layer includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In the depicted embodiment, the gate electrode includes polysilicon. The gate electrode may alternatively or additionally include a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate feature 240 may include numerous other layers, for example, capping layers, interface layers, diffusion layers, barrier layers, hard mask layers, other suitable layers, or combinations thereof. The gate feature 240 may include spacers. The gate feature 240 is formed by a suitable process, including deposition, lithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, or ion-beam writing. In yet another alternative, the lithography patterning process could implement nanoimprint technology. The etching processes include dry etching, wet etching, and/or other etching methods.

Figure 5A:
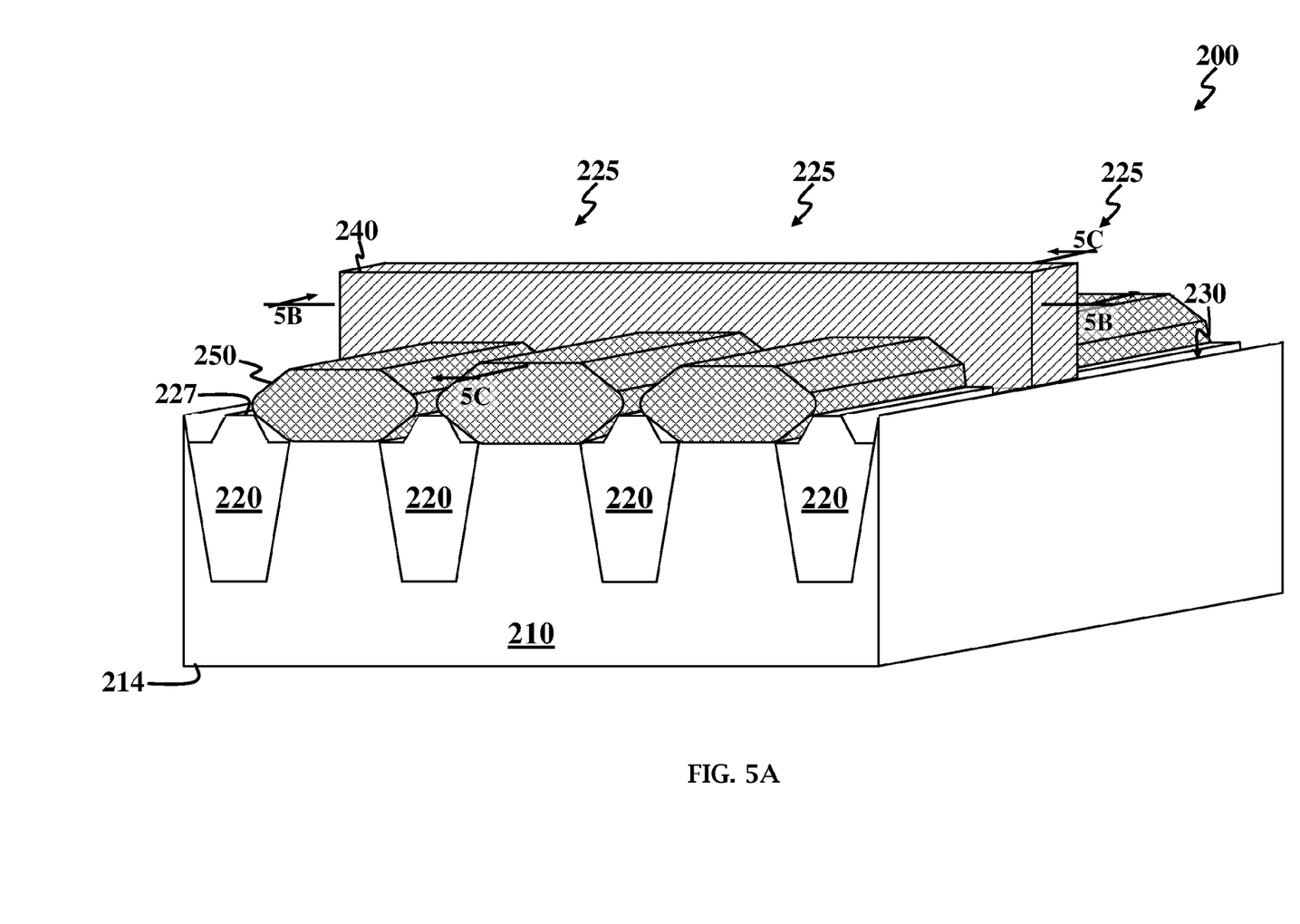
Figure 5B:
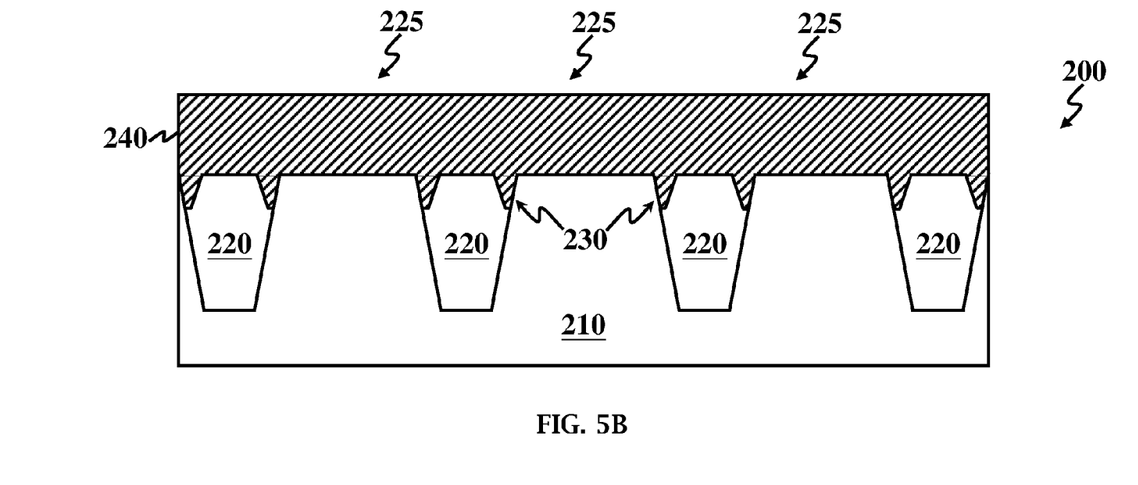
Figure 5C:
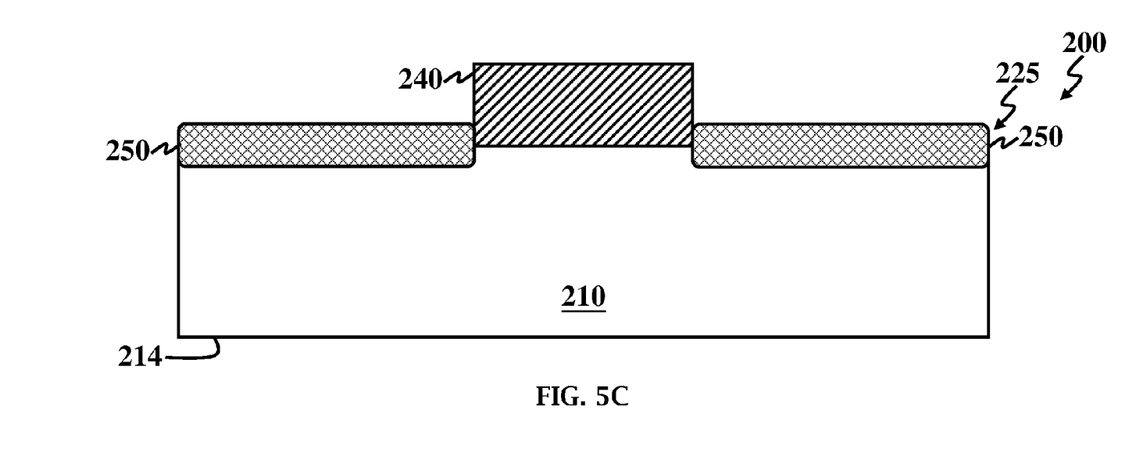

FIG. 5A is a perspective view of the integrated circuit device 200, FIG. 5B is a diagrammatic cross-sectional view of the integrated circuit device 200 taken along line 5B-5B in FIG. 5A, and FIG. 5C is a diagrammatic cross-sectional view of the integrated circuit device 200 taken along line 5C-5C in FIG. 5A. In FIGS. 5A-5C, the gate feature 240 interposes a source and drain feature 250, such that a channel is defined between the source feature and the drain feature. In the depicted embodiment, the source and drain features 250 are raised source and drain features formed by an epitaxial growth process. For example, a selective eptiaxiall grown process is used to form an epitaxial layer on exposed portions of the surface 212 of the substrate 210. The epitaxy processes includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 210 (e.g., silicon). In the depicted embodiment, the source and drain features 250 include silicon (Si). Alternatively, the source and drain features 250 include silicon germanium (SiGe). The source and drain features 250 may be a doped epi layer, which may be doped during its deposition (growth) by adding impurities to the source material of the epitaxy process or subsequent to its deposition growth process by an ion implantation process. For example, a silicon epi layer may be doped with phosphorous (to form a Si:P epi layer or a SiC:P epi layer). The doped epitaxial layer may have a gradient doping profile. In the depicted embodiment, the raised source and drain features 250 can reduce junction leakage that may arise from the FET devices in each FET device region 225. Various doped regions, such as lightly doped source and drain (LDD) regions and/or heavily doped source and drain (HDD) regions may be formed before or after the source and drain features 250.

Figure 6A:
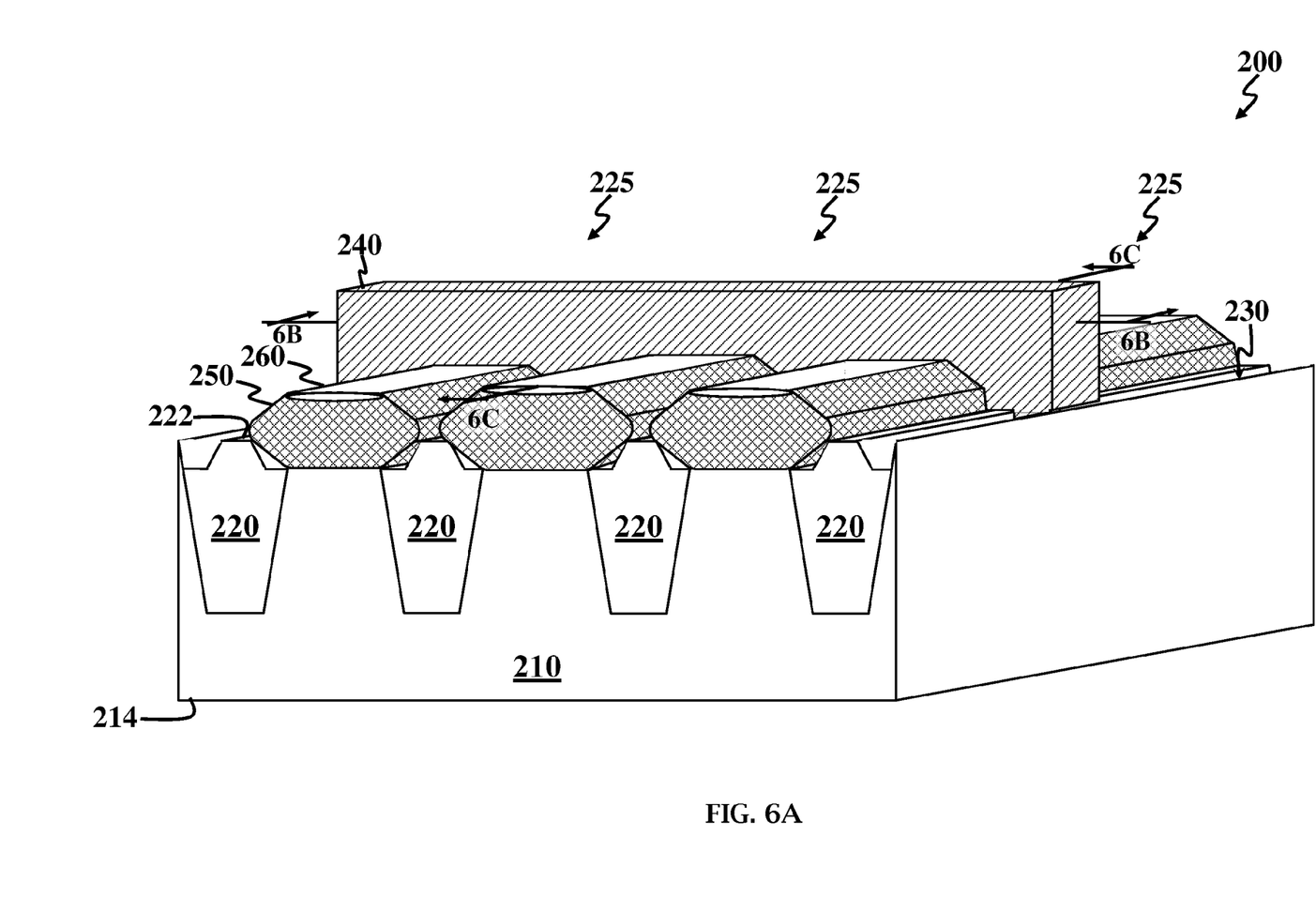
Figure 6B:
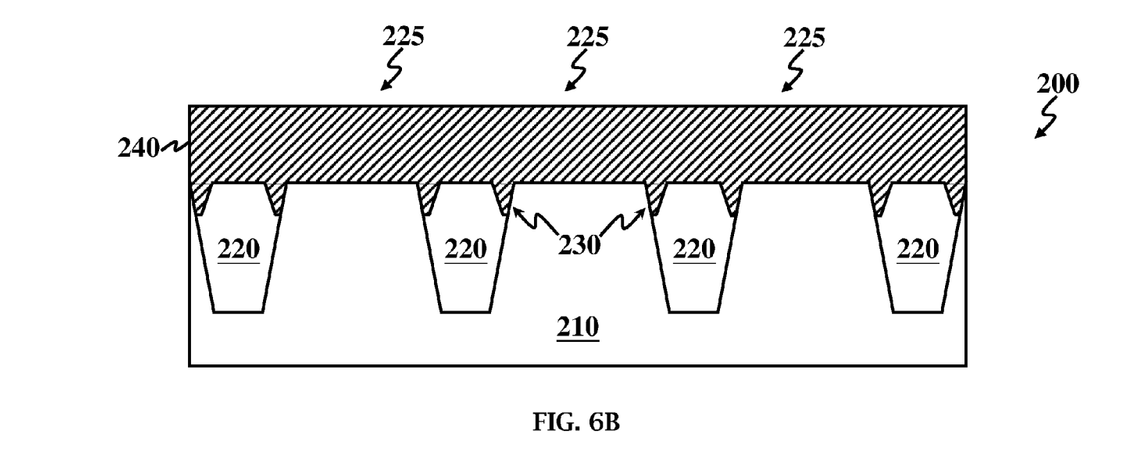
Figure 6C:
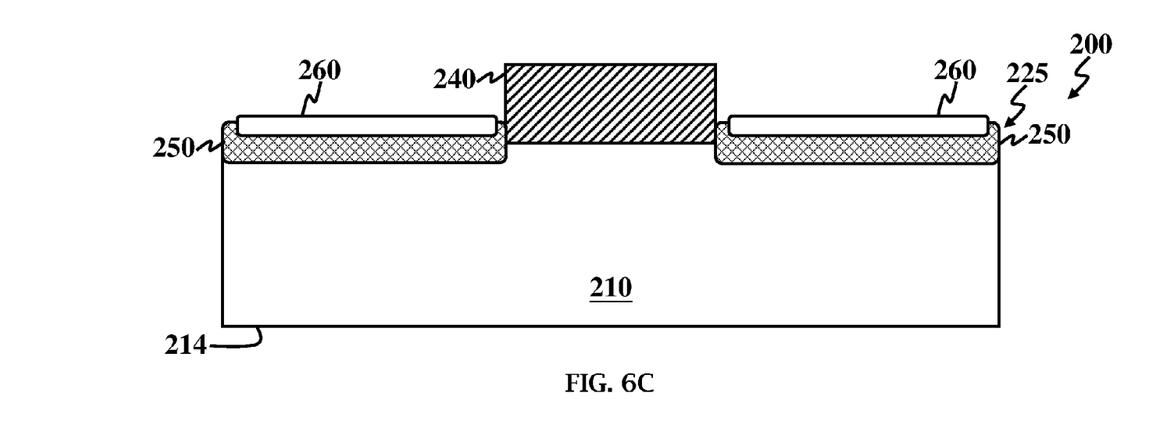

FIG. 6A is a perspective view of the integrated circuit device 200, FIG. 6B is a diagrammatic cross-sectional view of the integrated circuit device 200 taken along line 6B-6B in FIG. 6A, and FIG. 6C is a diagrammatic cross-sectional view of the integrated circuit device 200 taken along line 6C-6C in FIG. 6A. In FIGS. 6A-6C, silicide features 260 are disposed over and coupled to each source and drain feature 250. In the depicted embodiment, the silicide features 260 are disposed on a top surface of the source and drain features 250. The silicide features 260 comprises any suitable material, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the silicide features 260 are formed by a salicide (self-aligned silicide) process. A mask may be used to ensure that the silicide features 260 form on the top surface of the source and drain features 250.

The integrated circuit device 200 may include additional features, which may be formed by subsequent processing. For example, various contacts/vias/lines and multilayer interconnect features (e.g., metal layers and interlayer dielectrics) may be formed over the substrate 210, configured to connect the various features or structures of the integrated circuit device 200. The additional features may provide electrical interconnection to the device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 7A:
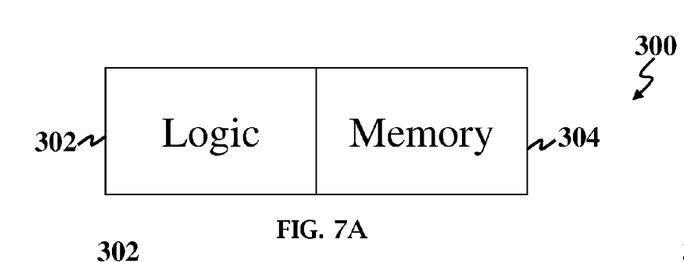
FIG. 7A is a simplified block diagram of an integrated circuit device that can be fabricated using the method of FIG. 1.
Figure 7B:
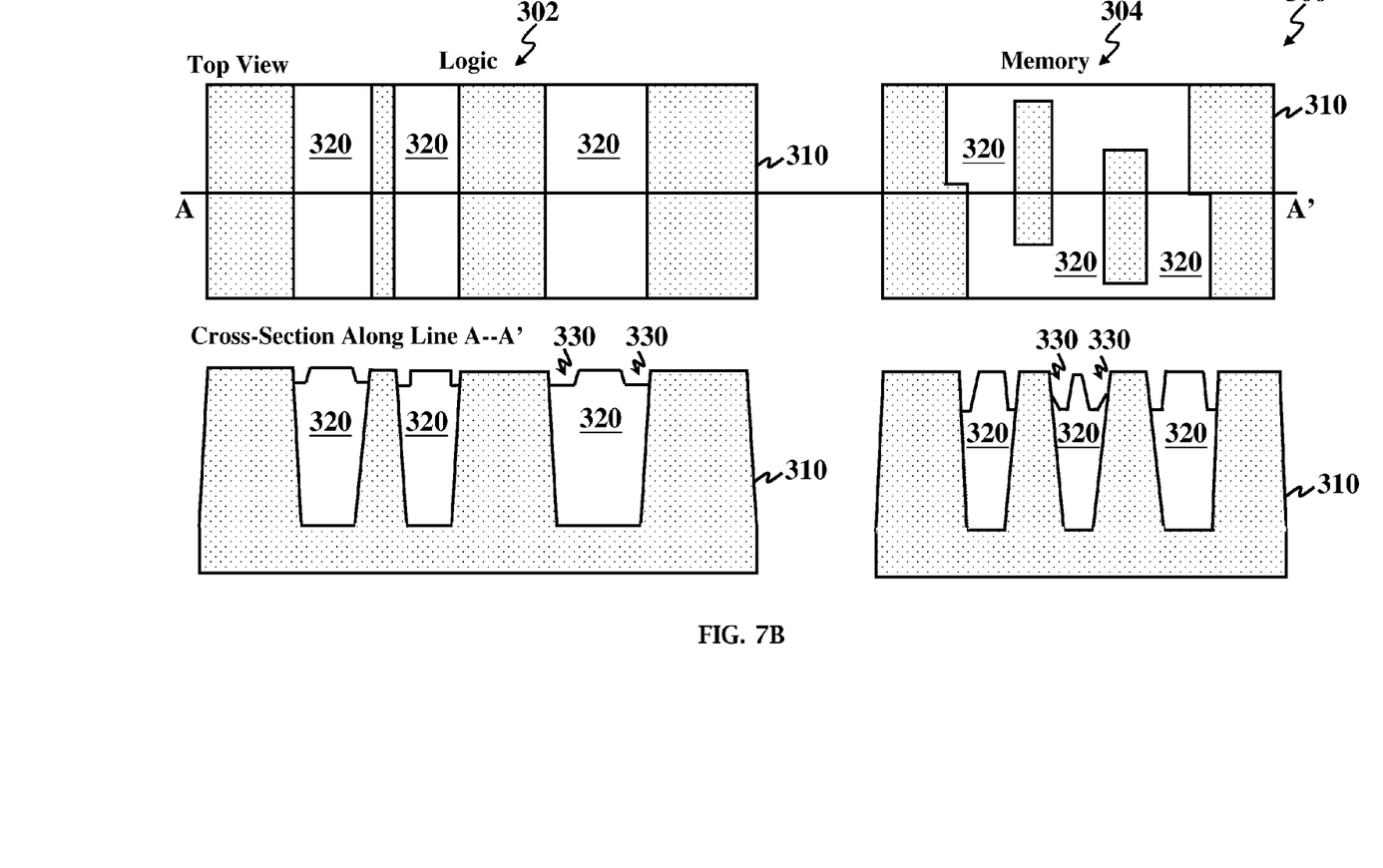
FIG. 7B is a top view and a cross-sectional view of the integrated circuit device of FIG. 7A.

FIG. 7A is a simplified block diagram of an integrated circuit device 300 that can be fabricated using the method 100 of FIG. 1, and FIG. 7B is a top view and a cross-sectional view of the integrated circuit device 300 of FIG. 7A. The integrated circuit device 300 includes a logic area 302 and a memory area 304. In the depicted embodiment, the memory area 304 includes a static random access memory (SRAM). The logic area 302 and the memory area 304 include a substrate 310. The substrate 310 may be similar to the substrate 210. Isolation features 320 separate various regions, such as active regions, of the substrate 310. The isolation features 320 are similar to the isolation features 220. For example, the isolation features 320 include divots 330, which have profiles similar to the divots 230 described above. In the depicted embodiment, the divots 330 in the logic area 302 are shallower than the divots 330 in the memory area 304. During the etching process used to form the divots 330, etching loading effects can cause the varying divot depths. As noted above, in an example, the depth of the divots is about 5 nanometers to about 40 nanometers. The etching process may thus be tuned to achieve a depth of about 5 nanometers to about 40 nanometers for the divots 330, despite the differing profiles that result because of pattern density differences. The etching process for forming the divots 330 may be implemented at any suitable point during the processing of integrated circuit device 300, for example, after forming the isolation features 330 or after forming doped regions, such as lightly doped source and drain regions. Similar to the integrated circuit 200 described above, gate features may be formed in a portion of the divots 330, so that devices of the integrated circuit device 300 have channels along a top and side surfaces of the substrate 310. This increases the effective width of such devices, which can improve threshold voltage variability of the integrated circuit device 200. This may also improve a $V_{cc,\,min}$ of devices in the memory area 304 of the integrated circuit device 300.

The present disclosure provides for many different embodiments. For example, a device includes a semiconductor substrate having a substrate surface; a trench isolation structure disposed in the semiconductor substrate, the trench isolation structure having a trench isolation structure surface that is substantially planar to the substrate surface; and a gate feature disposed over the semiconductor substrate, wherein the gate feature includes a portion that extends from the substrate surface to a depth in the trench isolation structure. The portion is defined by a trench isolation structure sidewall and a semiconductor substrate sidewall, such that the portion tapers from a first width at the substrate surface to a second width at the depth, the first width being greater than the second width. The device further includes a gate feature disposed over the substrate surface and the semiconductor substrate sidewall of the divot. The first width may be about 3 nanometers to about 20 nanometers, and the second width may be greater than about 3 nanometers. The depth may be about 5 nanometers to about 40 nanometers. The portion may further be defined by a bottom wall formed by the trench isolation structure, the bottom wall being at the depth in the trench isolation structure. The bottom wall may be substantially parallel to the substrate surface. In an example, the device further includes a source feature and a drain feature disposed over the substrate surface, the gate feature being disposed between the source feature and the drain feature. The source feature and the drain features includes epitaxial material. A silicide feature may be disposed over a top surface of the source feature and the drain feature. In an example, the gate feature includes polysilicon.

In another example, a field-effect transistor (FET) device includes a semiconductor substrate; a gate feature disposed over the semiconductor substrate; a trench isolation structure disposed in the semiconductor substrate; a gate feature disposed over the semiconductor substrate, the gate feature having a gate feature portion that extends into the trench isolation structure, the gate feature portion having a width that tapers from a surface of the trench isolation structure to the depth in the trench isolation structure, the first width being greater than the second width; and a source feature and a drain feature disposed over the semiconductor substrate, wherein the gate feature is disposed between the source feature and the drain feature. The gate feature portion may be defined by a tapered sidewall formed by a portion of the trench isolation structure, and a sidewall formed by a portion of the semiconductor substrate. The gate feature portion may further be defined by a bottom wall formed by another portion of the trench isolation structure, where the bottom wall is substantially parallel to the surface of the trench isolation structure. In an example, the gate feature is disposed over a substrate surface of the semiconductor substrate, the surface of the trench isolation structure being substantially planar with the substrate surface. The source feature and the drain feature may include an epitaxial material. A silicide feature may be disposed over the source feature and the drain feature. The depth of the divot may be about 5 nanometers and to about 40 nanometers.

In yet another example, a method includes forming a trench isolation structure in a semiconductor substrate, wherein the trench isolation structure has a trench isolation structure surface substantially planar with a semiconductor substrate surface; forming a divot in the trench isolation structure, the divot extending from the trench isolation structure surface to a depth in the trench isolation structure, wherein the divot has a trench isolation structure sidewall and a semiconductor substrate sidewall, the divot further having a width that tapers from a first width at the trench isolation structure surface to a second width at the depth in the trench isolation structure, wherein the first width is greater than the second width; and forming a gate feature over the semiconductor substrate surface and adjacent to the trench isolation structure, wherein the gate feature fills a portion of the divot. Forming the divot in the trench isolation structure may include performing a wet etching process. The wet etching process may use an etching recipe that includes diluted hydrofluoric acid (DHF). The divot may include a bottom wall of the divot that it substantially parallel to the semiconductor substrate surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a trench isolation structure in a semiconductor substrate, wherein the trench isolation structure has a trench isolation structure surface substantially planar with a semiconductor substrate surface;
forming a divot in the trench isolation structure without using a mask, the divot extending from the trench isolation structure surface to a depth in the trench isolation structure, wherein the divot has a trench isolation structure sidewall and a semiconductor substrate sidewall, the divot further having a width that tapers from a first width at the trench isolation structure surface to a second width at the depth in the trench isolation structure, wherein the first width is greater than the second width; and
forming a gate feature over the semiconductor substrate surface and adjacent to the trench isolation structure, wherein the gate feature fills a portion of the divot.

2. The method of claim 1 wherein the forming the divot in the trench isolation structure includes performing a wet etching process.

3. The method of claim 2 wherein the performing the wet etching process includes using an etching recipe that includes diluted hydrofluoric acid (DHF).

4. The method of claim 1 wherein the forming the divot in the trench isolation structure includes forming a bottom wall of the divot that it substantially parallel to the semiconductor substrate surface.

5. A field-effect transistor (FET) device comprising:
a semiconductor substrate;
a trench isolation structure disposed in the semiconductor substrate, the shallow trench isolation structure extending from a first sidewall of the semiconductor substrate to a second opposing sidewall of the semiconductor substrate;
a gate feature disposed over the semiconductor substrate and continuously extending over the substrate from the first sidewall of the semiconductor substrate to the second opposing sidewall of the semiconductor substrate to cover a topmost surface of the trench isolation structure surface, the gate feature having a gate feature portion that extends into the trench isolation structure, the gate feature portion having a width that tapers from a surface of the trench isolation structure to the depth in the trench isolation structure; and
a source feature and a drain feature disposed over the semiconductor substrate, wherein the gate feature is disposed between the source feature and the drain feature.

6. The FET device of claim 5 wherein the gate feature portion is defined by a tapered sidewall formed by a portion of the trench isolation structure and a sidewall formed by a portion of the semiconductor substrate.

7. The FET device of claim 6 wherein the gate feature portion is defined by a bottom wall formed by another portion of the trench isolation structure, the bottom wall being substantially parallel to the surface of the trench isolation structure.

8. The FET device of claim 5 wherein the gate feature is disposed over a substrate surface of the semiconductor substrate, the surface of the trench isolation structure being substantially planar with the substrate surface.

9. The FET device of claim 5 wherein the source feature and the drain feature include an epitaxial material.

10. The FET device of claim 9 further including a silicide feature disposed over the source feature and the drain feature.

11. The FET device of claim 5 wherein the depth is about 5 nanometers to about 40 nanometers.

12. A device comprising:
a semiconductor substrate having a substrate surface;
a trench isolation structure disposed in the semiconductor substrate, the trench isolation structure having a trench isolation structure surface that is a topmost surface that is substantially planar to the substrate surface, wherein no other portion of the trench isolation structure extends beyond the topmost surface; and
a gate feature disposed over the semiconductor substrate, wherein the gate feature includes a portion that extends from the substrate surface to a depth in the trench isolation structure, the portion being defined by a trench isolation structure sidewall and a semiconductor substrate sidewall, such that the portion tapers from a first width at the substrate surface to a second width at the depth, the first width being greater than the second width.

13. The device of claim 1 wherein the portion is further defined by a bottom wall at the depth in the trench isolation structure, the bottom wall being substantially parallel to the substrate surface.

14. The device of claim 1 wherein the first width is about 3 nanometers to about 20 nanometers.

15. The device of claim 1 wherein the second width is greater than about 3 nanometers.

16. The device of claim 1 wherein the depth is about 5 nanometers to about 40 nanometers.

17. The device of claim 1 further including a source feature and a drain feature disposed over the substrate surface, the gate feature being disposed between the source feature and the drain feature.

18. The device of claim 17 wherein the source feature and the drain features include epitaxial material.

19. The device of claim 17 further including a silicide feature disposed over a top surface of the source feature and the drain feature.

20. The device of claim 1 wherein the gate feature includes polysilicon.

* * * * *